United States Patent
Kim et al.

(10) Patent No.: US 9,065,070 B2
(45) Date of Patent: Jun. 23, 2015

(54) ORGANIC LIGHT-EMITTING DISPLAY APPARATUS AND METHOD OF MANUFACTURING THE SAME

(71) Applicant: Samsung Display Co., Ltd., Yongin, Gyeonggi-Do (KR)

(72) Inventors: Seung-Hun Kim, Yongin (KR); Cheol Jang, Yongin (KR); Seung-Yong Song, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/953,688

(22) Filed: Jul. 29, 2013

(65) Prior Publication Data

US 2014/0291621 A1 Oct. 2, 2014

(30) Foreign Application Priority Data

Apr. 2, 2013 (KR) .......................... 10-2013-0035958

(51) Int. Cl.
  *H01L 51/52* (2006.01)
  *H01L 51/56* (2006.01)
(52) U.S. Cl.
  CPC ............ *H01L 51/5237* (2013.01); *H01L 51/56* (2013.01)

(58) Field of Classification Search
  CPC ..... H01L 25/048; H01L 51/50; H01L 27/288; H01L 27/30; H01L 27/32; H01L 27/3274
  USPC .................... 257/40, 59, 72, E39.007
  See application file for complete search history.

(56) References Cited

U.S. PATENT DOCUMENTS

| 8,237,165 B2 | 8/2012 | Kim et al. |
| 2005/0156513 A1 | 7/2005 | Sano et al. |
| 2013/0208337 A1 * | 8/2013 | Lee et al. ............... 359/290 |

FOREIGN PATENT DOCUMENTS

| JP | 2005-157141 A | 6/2005 |
| KR | 10-2004-0085675 A | 10/2004 |
| KR | 10-2010-0130898 A | 12/2010 |
| KR | 10-2012-0001163 A | 1/2012 |

* cited by examiner

*Primary Examiner* — Hoai V Pham
(74) *Attorney, Agent, or Firm* — Christie, Parker & Hale LLP

(57) ABSTRACT

An organic light-emitting display apparatus and a method of manufacturing the same are provided. The organic light-emitting display apparatus includes a substrate, an organic light-emitting device on the substrate, an encapsulation layer covering the organic light-emitting device, and a low adhesive layer covering the encapsulation layer.

6 Claims, 5 Drawing Sheets

ORGANIC LIGHT-EMITTING DISPLAY APPARATUS AND METHOD OF MANUFACTURING THE SAME

CROSS-REFERENCE TO RELATED PATENT APPLICATIONS

This application claims priority to and the benefit of Korean Patent Application No. 10-2013-0035958, filed on Apr. 2, 2013, in the Korean Intellectual Property Office, the disclosure of which is incorporated herein in its entirety by reference.

BACKGROUND

1. Field

The present invention relates to an organic light-emitting display apparatus and a method of manufacturing the same.

2. Description of the Related Art

In general, an organic light-emitting display apparatus is a display apparatus including an organic light-emitting device, a pixel electrode, a counter electrode facing the pixel electrode, and an intermediate layer positioned between the pixel electrode and the counter electrode, wherein the organic light-emitting device includes a light-emitting layer, for each pixel.

Because an organic light-emitting device included in the organic light-emitting display apparatus is highly vulnerable to moisture or the like, the organic light-emitting device may be covered with an encapsulation layer to prevent or substantially prevent external impurities or contaminants from penetrating into the organic light-emitting device.

SUMMARY

An encapsulation layer may be damaged during a manufacturing process in a typical method of manufacturing an organic light-emitting display apparatus. If the encapsulation layer is damaged, protection by the encapsulation layer of an organic light-emitting device from external impurities and contaminants may be reduced.

Embodiments of the present invention provide an organic light-emitting display apparatus capable of preventing, substantially preventing, or reducing damage of an encapsulation layer for protecting an organic light-emitting device from external impurities during a manufacturing process, and a method of manufacturing the same. However, the above aspects of the present invention are only examples and the scope of the present invention is not limited thereto.

According to an embodiment of the present invention, there is provided an organic light-emitting display apparatus including: a substrate; an organic light-emitting device on the substrate; an encapsulation layer covering the organic light-emitting device; and a low adhesive layer covering the encapsulation layer.

The low adhesive layer may include fluorine.

A degree of adhesion between an adhesive layer of a temporary protective film and the low adhesive layer may be lower than a degree of adhesion between the low adhesive layer and the encapsulation layer.

The encapsulation layer may have a layered structure in which an organic layer and an inorganic layer are alternatingly arranged such that an outermost layer in contact with the low adhesive layer is an inorganic layer.

The organic light-emitting display apparatus may further include a final protective film on the low adhesive layer.

Also, the organic light-emitting display apparatus may further include: a functional layer on the low adhesive layer, and the functional layer may include at least one of a polarizing film or a touch film; and a final protective film on the functional layer.

The low adhesive layer may include at least a portion of products obtained by reacting tetrafluorocarbon and hydrogen.

According to another aspect of the present invention, there is provided a method of manufacturing an organic light-emitting display apparatus including: forming an organic light-emitting device on a substrate; forming an encapsulation layer to cover the organic light-emitting device; and forming a low adhesive layer covering the encapsulation layer.

A degree of adhesion between an adhesive layer of a temporary protective film and the low adhesive layer is lower than a degree of adhesion between the low adhesive layer and the encapsulation layer.

The low adhesive layer may include fluorine.

The forming of the encapsulation layer may be forming the encapsulation layer as a layered structure in which an organic layer and an inorganic layer are alternatingly arranged such that the inorganic layer is an outermost layer.

The method may further include attaching a temporary protective film on the low adhesive layer; removing the temporary protective film; and attaching a final protective film on the low adhesive layer.

The method may further include forming a functional layer including at least one of a polarizing film or a touch film on the low adhesive layer, wherein forming the functional layer occurs between the removing of the temporary protective film and the attaching of the final protective film.

Forming the low adhesive layer may include reacting tetrafluorocarbon and hydrogen.

Forming the low adhesive layer may include using a chemical vapor deposition method.

BRIEF DESCRIPTION OF THE DRAWINGS

The above and other features and aspects of embodiments of the present invention will become more apparent by describing in some detail example embodiments of the present invention with reference to the attached drawings in which.

DETAILED DESCRIPTION

Figure 1:
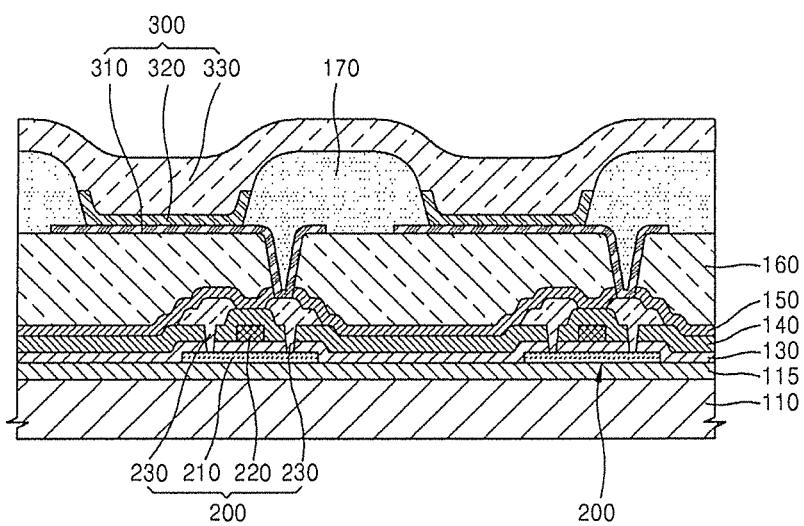
FIGS. 1 through 4 are cross-sectional views schematically illustrating a manufacturing process of an organic light-emitting display apparatus according to an embodiment of the present invention.

Hereinafter, the present invention will be described more fully with reference to the accompanying drawings, in which example embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. Also, in the drawings, the sizes of elements may be scaled up or down for convenience in description. For example, because the thickness and size of each element in the drawings are arbitrarily illustrated for convenience in description, the present invention is not limited to those illustrated.

When an element such as a layer, film, region, or substrate is referred to as being "on" another element, it can be directly on the other element or intervening elements may also be present.

As used herein, the term "and/or" includes any and all combinations of one or more of the associated listed items. Expressions such as "at least one of," when preceding a list of elements, modify the entire list of elements and do not modify the individual elements of the list.

FIGS. 1 through 4 are cross-sectional views schematically illustrating a manufacturing process of an organic light-emitting display apparatus according to an embodiment of the present invention.

According to a method of manufacturing an organic light-emitting display apparatus according to the present embodiment, an organic light-emitting device 300 is formed on a substrate 110 as illustrated in FIG. 1. However, a thin film transistor 200 controlling the presence and degree of light emission of the organic light-emitting device 300 may be formed before the organic light-emitting device 300 is formed.

The substrate 110 may be formed of various suitable materials, such as a glass material, a metallic material, or a plastic material, such as polyethylene terephthalate (PET), polyethylene naphthalate (PEN), and polyimide. Another layer, such as a buffer layer 115, may be added between the substrate 110 and the thin film transistor 200. However, the buffer layer 115 may be formed on or across an entire surface of the substrate 110 and may be formed in a patterned form.

When the thin film transistor 200 is formed on the substrate 110, a capacitor (not shown) in addition to the thin film transistor 200 may be formed together with the thin film transistor 200.

First, a semiconductor layer 210 is formed on the buffer layer 115. The semiconductor layer 210 may be formed of amorphous silicon, oxide, or polycrystalline silicon, or may be formed of an organic semiconductor material. In one embodiment, the semiconductor layer 210 may include a source region and a drain region that are doped with dopants, and a channel region. Thereafter, a gate dielectric 130 covering the semiconductor layer 210 is formed, and a gate electrode 220 is formed on the gate dielectric 130. However, a first capacitor electrode (not shown) may be concurrently (e.g., simultaneously) formed during the formation of the gate electrode 220.

The gate dielectric 130 may be typically formed to cover the entire surface of the semiconductor layer 210 and the buffer layer 115. In one embodiment, the gate dielectric layer 130 may be formed in a patterned form (e.g., across only portions of the semiconductor layer 210 and the buffer layer 115). The gate dielectric 130 may be formed of silicon oxide, silicon nitride, or other insulating organic and inorganic materials. The gate electrode 220, for example, may be formed as a single layer or with multiple layers, and may include one or more conductive materials such as aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), or a suitable alloy thereof, in consideration of adhesion with an adjacent layer, surface flatness of a stacked layer, and processability.

Subsequently, an interlayer dielectric 140 is formed of silicon oxide, silicon nitride, and/or other insulating organic and inorganic materials to cover the gate electrode 220 and the gate dielectric 130, and portions of the gate dielectric 130 and the interlayer dielectric 140 are removed to form a contact hole so as to expose a region (e.g., a predetermined region) of the semiconducting layer 210. The interlayer dielectric 140 may also be partially patterned. Thereafter, source electrode/drain electrodes 230 are formed to contact the semiconducting layer 210 through the contact hole and thus, the thin film transistor 220 may be formed. However, a second capacitor electrode (not shown) may be concurrently (e.g., simultaneously) formed during the formation of the source electrode/drain electrodes 230. Accordingly, a capacitor having the first capacitor electrode positioned or located (e.g., formed) on the same layer as the gate electrode 220 and the second capacitor electrode positioned or located (e.g., formed) on the same layer as the source electrode/drain electrodes 230 may be formed on the substrate 110. The source electrode/drain electrode 230, for example, may be formed as a single layer or multiple layers, and may include a conductive material such as Al, Pt, Pd, Ag, Mg, Au, Ni, Nd, Ir, Cr, Li, Ca, Mo, Ti, W, and Cu, or a suitable alloy thereof, in consideration of conductivity and the like.

After the thin film transistor 200 is formed, a protective layer 150 is formed of silicon oxide, silicon nitride, and/or other suitable insulating organic and inorganic materials to cover the source electrode/drain electrodes 230 of the thin film transistor 200 and the interlayer dielectric 140. As illustrated in FIG. 1, a planarization layer 160 having a substantially flat top surface is formed on the protective layer 150. The planarization layer 160 may be formed of an acrylic inorganic, a polyimide, or benzocyclobutene (BCB), and may be formed of silicon oxide or silicon nitride. A top portion of the planarization layer 160 thus formed may be planarized by a suitable planarization technique such as a mechanical method (such as milling).

After the formation of the planarization layer 160, a via hole is formed in the protective layer 150 and the planarization layer 160 so as to expose any one of the source electrode/drain electrodes 230 of the thin film transistor 200 through the protective layer 150 and the planarization layer 160. Next, a pixel electrode 310 is formed on the planarization layer 160 to be electrically coupled to the thin film transistor 200 through the via hole. A pixel-defining layer 170 having a single or multilayer structure is formed of an organic material, such as polyacrylate and polyimide, or a material, such as a suitable inorganic layer, so as to expose a portion including a center portion of the pixel electrode 310.

The pixel electrode 310 may be formed as a (semi) transparent electrode or a reflective electrode. In a case where the pixel electrode 310 is formed as a (semi) transparent electrode, the pixel electrode 310, for example, may be formed of indium tin oxide (ITO), indium zinc oxide (IZO), zinc oxide (ZnO), indium oxide ($In_2O_3$), indium gallium oxide (IGO), or aluminum zinc oxide (AZO). In a case where the pixel electrode 310 is formed as a reflective electrode, the pixel electrode 310 may include a reflective layer formed of Ag, Mg, Al, Pt, Pd, Au, Ni, Nd, Ir, Cr, or a compound thereof, and a layer formed of ITO, IZO, ZnO, or $In_2O_3$. However, the configuration and material of the pixel electrode 310 are not limited thereto, and various modifications may be possible.

The pixel-defining layer 170 may define a pixel by having an opening corresponding to each sub-pixel, i.e., an opening to expose the center portion of the pixel electrode 310 or the entire pixel electrode 310. Also, the pixel-defining layer 170 may act to prevent (or substantially prevent) the generation of arcs at edges of the pixel electrode 310 by increasing distances between the edges of the pixel electrode 310 and a counter electrode 330 above the pixel electrode 310.

Thereafter, an intermediate layer 320, including a light-emitting layer, is formed, and the counter electrode 330 is subsequently formed so as to at least correspond to the pixel electrode 310 or correspond to most of the area of the substrate 110, and thus, an organic light-emitting display apparatus, including the organic light-emitting device 300 that is electrically coupled to the thin film transistor 200, may be manufactured.

The intermediate layer 320 positioned or located (e.g., formed) between the pixel electrode 310 and the counter electrode 330 may be formed of a low molecular weight material or a polymer material. In a case where the intermediate layer 320 is formed of a low molecular weight material, the intermediate layer 320 may be formed by stacking or layering a hole injection layer (HIL), a hole transport layer (HTL), an emission layer (EML), an electron transport layer (ETL), and an electron injection layer (EIL) in a single or composite structure. Various suitable materials including copper phthalocyanine (CuPc), N,N'-di(naphthalene-1-yl)-N,N'-diphenyl-benzidine (NPB), and tris-8-hydroxyquinoline aluminum (Alq3) may be used as an organic material suitable for the intermediate layer 320. The above layers may be formed by a suitable deposition technique, such as vacuum deposition or laser-induced thermal imaging (LITI).

In a case where the intermediate layer 320 is formed of a polymer material, the intermediate layer 320 may have a structure generally including an HTL and an EML, in which poly-(3,4)-ethylene-dihydroxy thiophene (PEDOT) or polyaniline (PANI) may be used as the HTL, and a polymer material, such as poly-phenylenevinylenes (PPVs) and polyfluorenes, may be used as the EML. The above layers may be formed by a suitable deposition technique, such as screen printing, inkjet printing, or LITI.

However, the intermediate layer 320 is not limited thereto, and the intermediate layer 320 may also have various structures.

The counter electrode 330 may cover a display area (active area) by being formed in one piece or a continuous layer in a plurality of pixels. Herein, the expression "display area" denotes all areas in which light may be emitted by an entire organic light-emitting display apparatus, and for example, may denote all areas except edges of the organic light-emitting display apparatus on which a controller or the like is positioned or located. However, in a case where a dead area does not exist on an entire surface of the organic light-emitting display apparatus, the entire surface of the organic light-emitting display apparatus may be denoted as the display area.

The counter electrode 330 may be in contact with an electrode power supply line outside of the display area to receive an electrical signal from the electrode power supply line. The counter electrode 330 may be formed as a (semi) transparent electrode or a reflective electrode. In a case where the counter electrode 330 is formed as a (semi) transparent electrode, the counter electrode 330 may include a layer in which Li, Ca, LiF/Ca, LiF/Al, Al, Mg, or a compound thereof is deposited to face the intermediate layer 320, or an auxiliary electrode or a bus electrode line formed of a (semi) transparent material, such as ITO, IZO, ZnO, or $In_2O_3$. In a case where the counter electrode 330 is formed as a reflective electrode, the counter electrode 330, for example, may have a layer including one or more materials of Li, Ca, LiF/Ca, LiF/Al, Al, Ag, and Mg. However, the configuration and material of the counter electrode 330 are not limited thereto, and various modifications may be possible.

Figure 2:
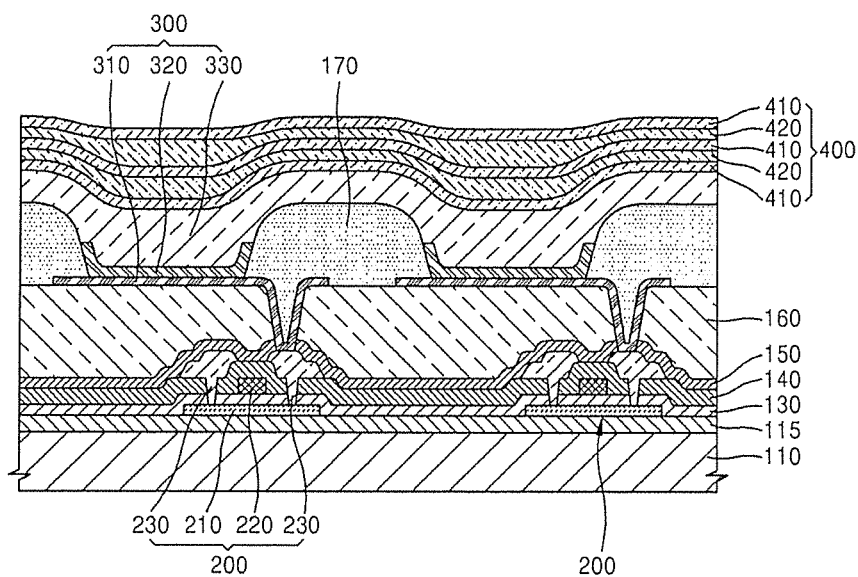

After the organic light-emitting device 300 is formed on the substrate 110, an encapsulation layer 400 is formed to cover the organic light-emitting device 300, as illustrated in FIG. 2. In one embodiment, the encapsulation layer 400 having a layered structure is formed, in which an organic layer 420 and an inorganic layer 410 are alternatingly arranged (e.g., formed) with the inorganic layer 410 as an outermost layer.

Because the organic light-emitting device 300 may be easily deteriorated by an external factor, such as external moisture or oxygen, the encapsulation layer 400 may prevent external oxygen or moisture from penetrating into the organic light-emitting device 300. In this case, because external impurities may penetrate through the encapsulation layer 400 when the encapsulation layer 400 is formed in a single layer structure, the encapsulation layer 400 may be allowed to have a multilayer structure. In this case, when the encapsulation layer 400 is formed only as an organic layer or an inorganic layer, oxygen or moisture may penetrate from the outside through fine passages formed in the encapsulation layer 400. Therefore, in order not to generate fine passages interconnected to the organic light-emitting device 300 in the encapsulation layer 400, the encapsulation layer 400 may have a layered structure in which the organic layer 420 and the inorganic layer 410 are alternatingly stacked, and thus, the generation of the interconnected fine passages may be prevented, substantially prevented, or reduced.

When the encapsulation layer 400 is formed, the outermost layer of the encapsulation layer 400 may include the inorganic layer 410 by using a material such as silicon nitride and/or silicon oxide. The reason for this is that a mechanical strength of an inorganic layer may be higher than that of an organic layer.

Figure 3:
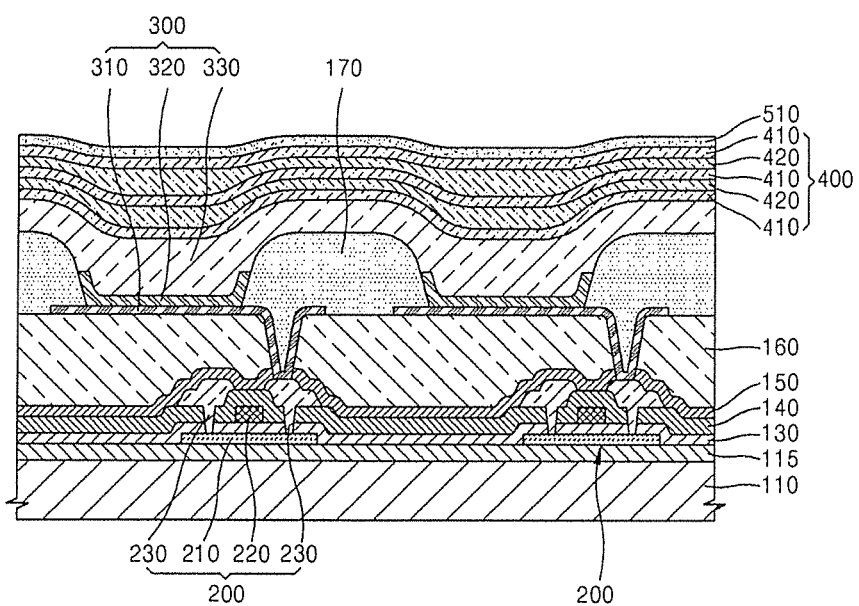

After the encapsulation layer 400 is formed, a low adhesive layer 510 covering the encapsulation layer 400 is formed as illustrated in FIG. 3. The low adhesive layer 510 may include a material in which a degree or level of adhesion between the low adhesive layer 510 and another adhesive layer that is subsequently formed over the low adhesive layer 510 may be lower than a degree or level of adhesion between the adhesive layer 510 and the encapsulation layer 400. That is, the low adhesive layer 510 may include a material in which the degree of adhesion between another adhesive layer to be in contact with the low adhesive layer 510 at a later time is lower than a degree of adhesion between the low adhesive layer 510 and the inorganic layer 410, the outermost layer of the encapsulation layer 400. In other words, the low adhesive layer 510 may adhere more strongly to the encapsulation layer 400 than to an adhesive layer of a temporary protective film 530' which may be attached to the low adhesive layer 510 later. For example, the low adhesive layer 510 may include fluorine or another suitable low adhesive layer material.

The low adhesive layer 510 (e.g., including fluorine) may be formed by reacting tetrafluorocarbon ($CF_4$) and hydrogen ($H_2$). In one embodiment, the low adhesive layer 510 may be formed by using a chemical vapor deposition method, and in this case, tetrafluorocarbon is reacted with hydrogen to generate methane ($CH_4$) and fluorine. Thus, the low adhesive layer 510, a fluorine layer, or a layer including fluorine, is formed on the encapsulation layer 400.

In a case where the chemical vapor deposition method is used to form the low adhesive layer 510, because the inorganic layer 410, the outermost layer of the encapsulation layer 400, may be formed by using the chemical vapor deposition method and the low adhesive layer 510 may be subsequently formed in the same chamber, the low adhesive layer 510 may be effectively formed while maintaining relatively high productivity. Because the low adhesive layer 510 is a hydrophobic layer, the low adhesive layer 510 may effectively prevent or reduce corrosion of the inorganic layer 410 of the encapsulation layer 400 due to moisture during a subsequent manufacturing process or after completion of the manufacturing of the organic light-emitting display apparatus.

Figure 4:
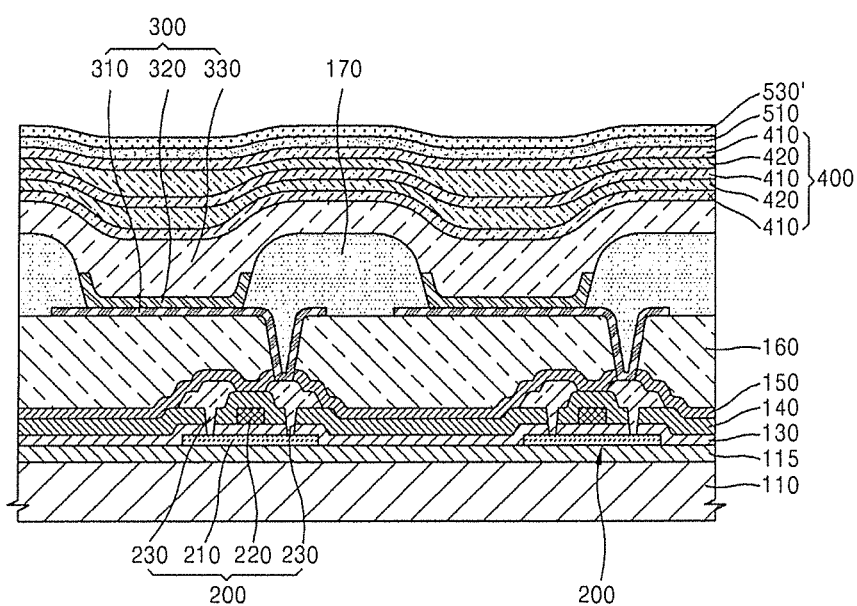

After the formation of the low adhesive layer 510, a temporary protective film 530' may be attached to the low adhesive layer 510, as illustrated in FIG. 4, in order for the organic light-emitting device 300 or the encapsulation layer 400 not to be damaged during a subsequent manufacturing process. After the attachment of the temporary protective film 530', a subsequent process, e.g., scribing and/or a cleaning process, may be performed. Herein, the expression "scribing" denotes that, in a state of attaching a temporary protective film after a plurality of display areas having an organic light-emitting device as a pixel are formed on a mother substrate, and an encapsulation layer and a low adhesive layer are then formed, a plurality of organic light-emitting display apparatuses are concurrently (e.g., simultaneously) manufactured by cutting the mother substrate along the outside of the plurality of display areas.

In a case where the subsequent process, such as scribing and/or a cleaning process, is performed, the low adhesive layer 510 or the encapsulation layer 400 may be damaged if the temporary protective film 530' does not exist. Therefore, in order to prevent the damage thereof, the subsequent process may be performed in a state of having the temporary protective film 530' attached on the low adhesive layer 510. The temporary protective film 530' may be removed after the subsequent process is performed.

The temporary protective film 530' may have a structure including a layer formed of a material, such as polyethylene terephthalate, and an adhesive layer coated on one surface of the layer.

Therefore, when the temporary protective film 530' is attached to any surface and then detached after the subsequent process has been performed, the surface having the temporary protective film 530' attached thereto may be damaged due to the adhesion of the adhesive layer.

For example, it may be considered that the temporary protective film 530' is attached to the encapsulation layer 400 as illustrated in FIG. 2, before the low adhesive layer 510 is formed. In this case, because the adhesion between the inorganic layer 410, such as silicon oxide and/or silicon nitride, as the outermost layer of the encapsulation layer 400 and the adhesive layer of the temporary protective film 530' is high, defects, in which a portion of the inorganic layer 410 is delaminated by being adhered to the temporary protective film 530' or a surface of the inorganic layer 410 is damaged, may occur during the detachment of the temporary protective film 530' after the subsequent process is performed. The defects may eventually cause degradation of the performance of the encapsulation layer 400 and may subsequently cause damage of the organic light-emitting device due to external oxygen, moisture, or other contaminants reacting or interacting with the organic light-emitting device.

However, with respect to the method of manufacturing an organic light-emitting display apparatus, according to the present embodiment, the low adhesive layer 510 is formed on the encapsulation layer 400 and the temporary protective film 530' is attached to the low adhesive layer 510 as described above. In this case, because the adhesion between the adhesive layer of the temporary protective film 530' and the low adhesive layer 510 is lower than the adhesion between the adhesive layer of the temporary protective film 530' and the inorganic layer 410, the temporary protective film 530' may be effectively detached or removed while surface damage of the low adhesive layer 510 is minimized during the detachment of the temporary protective film 530' after the subsequent process is performed.

Therefore, according to the method of manufacturing an organic light-emitting display apparatus, according to the present embodiment, an organic light-emitting display apparatus having the low adhesive layer 510 with minimized surface damage may be manufactured by removing the temporary protective film 530' as illustrated in FIG. 3.

Figure 5:
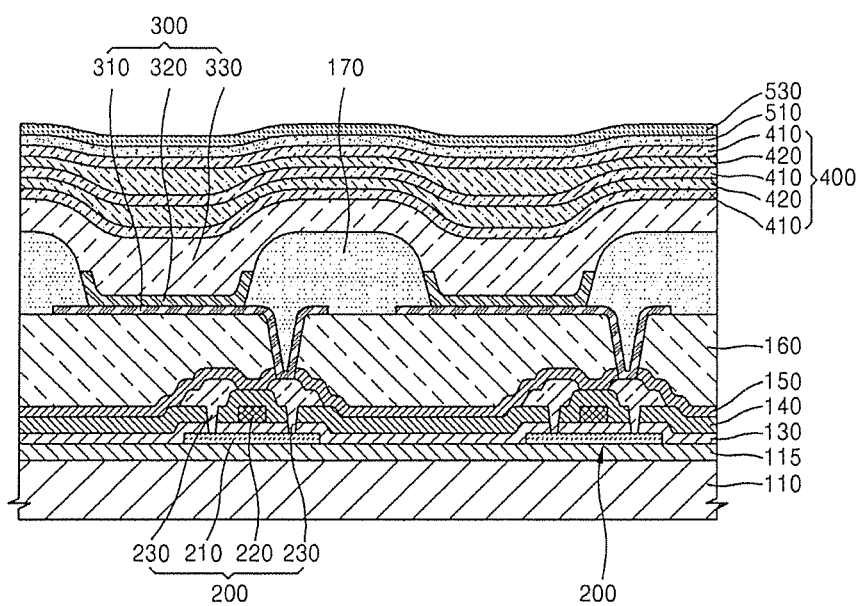
FIG. 5 is a cross-sectional view schematically illustrating an organic light-emitting display apparatus according to another embodiment of the present invention.

However, as illustrated in FIG. 5, in one embodiment, a final protective film 530 may be attached to or formed over the low adhesive layer 510 after removing the temporary protective film 530'. For example, the final protective film 530 may protect a surface of the organic light-emitting display apparatus by performing a hard coating treatment with polyethylene terephthalate, even in the case that a mechanical impact from the outside is applied.

In one embodiment, before the final protective film 530 is attached after the temporary protective film 530' has been removed, a functional layer including at least any one of layers, such as a polarizing film and a touch film, is formed on the low adhesive layer 510, and the final protective film 530 may be attached to the functional layer. In using the organic light-emitting display apparatus after the manufacture thereof is completed, the polarizing film may act to prevent or reduce a rapid decrease in visibility of an image reproduced in the display apparatus while external light is incident on the organic light-emitting display apparatus and reflected back therefrom.

While the method of manufacturing an organic light-emitting display apparatus has been described, embodiments of the present invention are not limited thereto. For example, an organic light-emitting display apparatus manufactured by using the same method or a similar method may also be included in the scope of the present invention.

The organic light-emitting display apparatus according to an embodiment of the present invention may have a structure as illustrated in FIG. 3. That is, the organic light-emitting display apparatus may include a substrate 110, an organic light-emitting device 300 positioned or located (e.g., formed) on the substrate 110, an encapsulation layer 400 covering the organic light-emitting device 300, and a low adhesive layer 510 covering the encapsulation layer 400.

The low adhesive layer 510 may include fluorine, and the adhesion of an adhesive layer with the low adhesive layer 510 may be controlled to be lower than the adhesion of the adhesive layer with the encapsulation layer 400. In one embodiment, the encapsulation layer 400 may have a layered structure in which an organic layer 420 and an inorganic layer 410 are alternatingly arranged (e.g., formed) so as to allow the inorganic layer 410 to be a portion in contact with the low adhesive layer 510, wherein the adhesion of the adhesive layer with the low adhesive layer 510 may be controlled to be lower than the adhesion of the adhesive layer with the inorganic layer 410, the outermost layer of the encapsulation layer 400. Accordingly, when a temporary protective film is attached to the low adhesive layer 510 during the manufacturing process and then detached after a subsequent process has been performed, the temporary protective film may be cleanly detached while the low adhesive layer 510 is not damaged.

However, because the low adhesive layer 510 including fluorine is a hydrophobic layer, the low adhesive layer 510 may effectively prevent or reduce corrosion of the inorganic layer 410 of the encapsulation layer 400 due to moisture or other external contaminants during a subsequent manufacturing process or after completion of the manufacturing of the organic light-emitting display apparatus.

As described above, the low adhesive layer 510 may be formed to include at least a portion of products obtained by reacting $CF_4$ and $H_2$, and in one embodiment, the low adhesive layer 510 may be formed by using a chemical vapor deposition method. In this case, because the inorganic layer 410, the outermost layer of the encapsulation layer 400, may be formed by using a chemical vapor deposition method and the low adhesive layer 510 may be subsequently formed in the same chamber, the low adhesive layer 510 may be effectively formed while maintaining productivity.

As illustrated in FIG. 5, an organic light-emitting display apparatus according to another embodiment of the present invention may further include the final protective film 530 positioned or located (e.g., formed) on the low adhesive layer 510. For example, the final protective film 530 may protect a surface of the organic light-emitting display apparatus by performing a hard coating treatment with polyethylene terephthalate, even in the case that a mechanical impact from the outside is applied.

In one embodiment, before the final protective film 530 is attached, a functional layer including at least any one of layers, such as a polarizing film and a touch film, is formed on the low adhesive layer 510, and the final protective film 530 may be attached to the functional layer.

According to an embodiment of the present invention, an organic light-emitting display apparatus capable of preventing or reducing damage of an encapsulation layer and protecting an organic light-emitting device from external impurities or contaminants during a manufacturing process, and a method of manufacturing the same may be realized. However, the scope of the embodiments of the present invention is not limited to such effects.

While the present invention has been shown and described with reference to example embodiments thereof, it will be understood by those of ordinary skill in the art that various changes in form and details may be made therein without departing from the spirit and scope of the present invention as defined by the following claims, and their equivalents.

What is claimed is:

1. An organic light-emitting display apparatus comprising:
    a substrate;
    an organic light-emitting device on the substrate;
    an encapsulation layer covering the organic light-emitting device; and
    a low adhesive layer covering the encapsulation layer, wherein the encapsulation layer has a layered structure in which an organic layer and an inorganic layer are alternatingly arranged such that an outermost layer in contact with the low adhesive layer is an inorganic layer.

2. The organic light-emitting display apparatus of claim 1, wherein the low adhesive layer comprises fluorine.

3. The organic light-emitting display apparatus of claim 1, wherein a degree of adhesion between an adhesive layer of a temporary protective film and the low adhesive layer is lower than a degree of adhesion between the low adhesive layer and the encapsulation layer.

4. The organic light-emitting display apparatus of claim 1, further comprising a final protective film on the low adhesive layer.

5. The organic light-emitting display apparatus of claim 1, further comprising:
    a functional layer on the low adhesive layer and comprising at least one of a polarizing film or a touch film; and a final protective film on the functional layer.

6. The organic light-emitting display apparatus of claim 1, wherein the low adhesive layer comprises at least a portion of products obtained by reacting tetrafluorocarbon and hydrogen.

* * * * *